(12) United States Patent
Ohtsuka et al.

(10) Patent No.: US 9,153,443 B2
(45) Date of Patent: Oct. 6, 2015

(54) SEMICONDUCTOR DEVICE AND METHOD OF FABRICATING SAME

(75) Inventors: Kenichi Ohtsuka, Tokyo (JP); Hiroshi Watanabe, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 27 days.

(21) Appl. No.: 14/009,685

(22) PCT Filed: Mar. 12, 2012

(86) PCT No.: PCT/JP2012/001677
§ 371 (c)(1),
(2), (4) Date: Oct. 3, 2013

(87) PCT Pub. No.: WO2012/137412
PCT Pub. Date: Oct. 11, 2012

(65) Prior Publication Data
US 2014/0021490 A1   Jan. 23, 2014

(30) Foreign Application Priority Data

Apr. 5, 2011   (JP) .................................. 2011-083725

(51) Int. Cl.
*H01L 29/66* (2006.01)
*H01L 21/265* (2006.01)
(Continued)

(52) U.S. Cl.
CPC ........ *H01L 21/26506* (2013.01); *H01L 21/046* (2013.01); *H01L 23/544* (2013.01); *H01L 29/0615* (2013.01); *H01L 29/0657* (2013.01); *H01L 29/0661* (2013.01); *H01L 29/1095* (2013.01); *H01L 29/6606* (2013.01); *H01L 29/66068* (2013.01); *H01L 29/7395* (2013.01);
(Continued)

(58) Field of Classification Search
None
See application file for complete search history.

(56) References Cited

U.S. PATENT DOCUMENTS 4,667,393 A   5/1987   Ferla et al.
5,907,181 A   5/1999   Han et al.
(Continued)

FOREIGN PATENT DOCUMENTS

JP   61 59868   3/1986
JP   7 302896   11/1995
(Continued)

OTHER PUBLICATIONS

Japanese Office Action issued Nov. 5, 2013, in Japan Patent Application No. 2013-508733 (with English translation).
(Continued)

*Primary Examiner* — Yasser A Abdelaziez
(74) *Attorney, Agent, or Firm* — Oblon, McClelland, Maier & Neustadt, L.L.P.

(57) ABSTRACT

Fabrication of a termination structure in a semiconductor device increases in some cases the numbers of ion implantation processes or of photolithography processes, thus leading to an increase in fabrication costs. To overcome this problem, a semiconductor device is provided which includes an n-type drift layer formed on a semiconductor substrate; an element region formed in a surface portion of the drift layer; a recess formed in a loop in a laterally outer portion of the drift layer, spaced away a predetermined distance from the element region; and a p-type dopant region formed ranging from a bottom of the recess to a position away from the recess and toward the element region, a thickness of the dopant region where no recess is provided being greater than that where the recess is provided.

16 Claims, 7 Drawing Sheets

(51) Int. Cl.
*H01L 29/06* (2006.01)
*H01L 29/10* (2006.01)
*H01L 29/739* (2006.01)
*H01L 29/78* (2006.01)
*H01L 29/872* (2006.01)
*H01L 21/04* (2006.01)
*H01L 23/544* (2006.01)
*H01L 29/16* (2006.01)

(52) U.S. Cl.
CPC .......... *H01L 29/7811* (2013.01); *H01L 29/872* (2013.01); *H01L 29/0692* (2013.01); *H01L 29/0696* (2013.01); *H01L 29/1608* (2013.01); *H01L 2223/5442* (2013.01); *H01L 2223/54426* (2013.01); *H01L 2223/54453* (2013.01); *H01L 2924/0002* (2013.01)

(56) References Cited

U.S. PATENT DOCUMENTS

| | | |
|---|---|---|
| 6,476,458 B2 | 11/2002 | Miyajima |
| 6,573,534 B1 | 6/2003 | Kumar et al. |
| 2002/0063301 A1* | 5/2002 | Hanamoto et al. ............ 257/432 |
| 2003/0183900 A1 | 10/2003 | Barthelmess et al. |
| 2006/0051923 A1 | 3/2006 | Falck et al. |
| 2009/0098719 A1 | 4/2009 | Matsuno et al. |
| 2010/0025693 A1 | 2/2010 | Malhan et al. |
| 2011/0095301 A1* | 4/2011 | Tarui ............................... 257/77 |

FOREIGN PATENT DOCUMENTS

| | | |
|---|---|---|
| JP | 8 321516 | 12/1996 |
| JP | 9 8050 | 1/1997 |
| JP | 11 330091 | 11/1999 |
| JP | 2001 508950 | 7/2001 |
| JP | 2002 164541 | 6/2002 |
| JP | 2003 303956 | 10/2003 |
| JP | 2004 510333 | 4/2004 |
| JP | 2005 57142 | 3/2005 |
| JP | 2007 273727 | 10/2007 |
| JP | 2008 124362 | 5/2008 |
| JP | 2009 94392 | 4/2009 |
| JP | 2010 34381 | 2/2010 |
| JP | 2010 225615 | 10/2010 |
| JP | 2011 96757 | 5/2011 |
| JP | 2011 204935 | 10/2011 |

OTHER PUBLICATIONS

International Search Report Issued Apr. 3, 2012 in PCT/JP12/01677 filed Mar. 12, 2012.

* cited by examiner

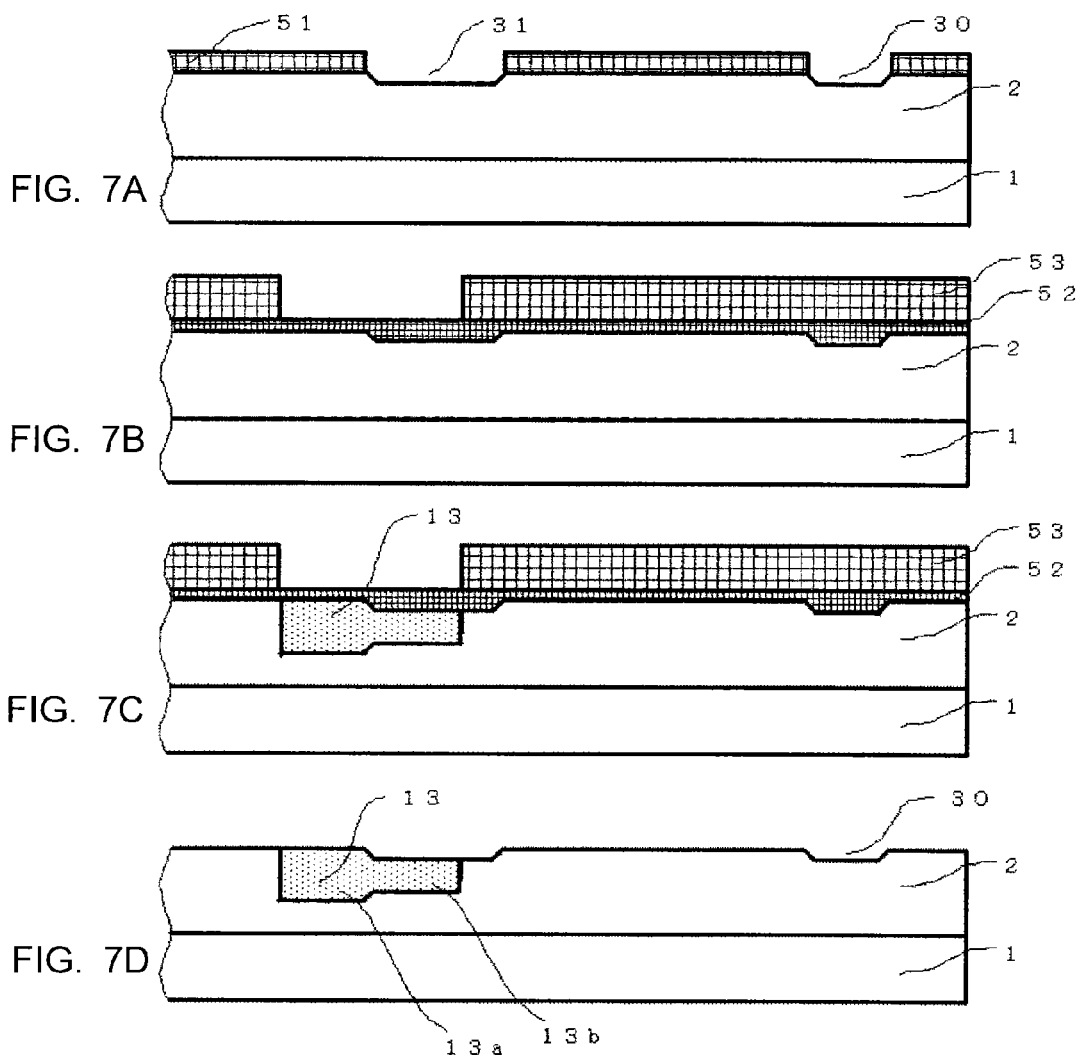
FIG. 7A
FIG. 7B
FIG. 7C
FIG. 7D
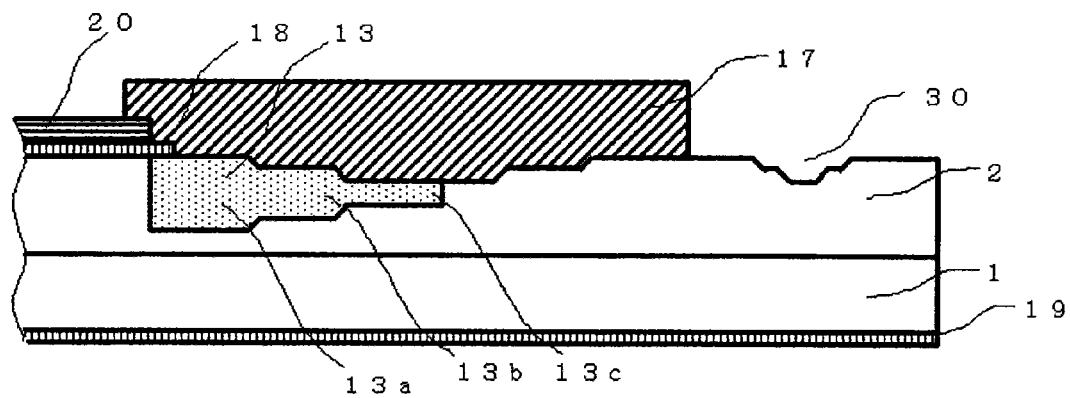
FIG. 8

US 9,153,443 B2

SEMICONDUCTOR DEVICE AND METHOD OF FABRICATING SAME

TECHNICAL FIELD

The present invention relates to semiconductor devices, such as silicon carbide semiconductor devices, and in particular to an electric field relaxation structure of the semiconductor device for use as a power semiconductor device.

BACKGROUND ART

A silicon carbide (SiC) power semiconductor device is known as a device having excellent temperature and breakdown voltage characteristics. An electric field relaxation structure, which is called termination structure, is provided to a laterally outer edge of an active region of the power semiconductor device.

Known as a termination structure of the Schottky diode element—a kind of the power semiconductor device—is, for example, a junction termination extension (JTE) structure in which a region of conductivity different from that of a semiconductor region in the lower center of a Schottky electrode is provided in the semiconductor region of a perimeter of the Schottky electrode, and a dopant concentration in the termination structure is gradually reduced toward a circumference of the element (a literature such as Patent Document 1). Another structure is also known in which, in addition to a planar direction of the device, regions having plural dopant concentrations are provided also in a depth direction thereof, and a dopant sheet density of a termination structure is gradually reduced toward a circumference of the element (a literature such as Patent Document 2).

In order to form such a structure where the dopant concentration and the dopant sheet density are varied gradually, additional doping process such as ion implantation or epitaxial growth is performed. For that reason, the number of fabrication processes required for forming the structure having the dopant profile gradually varied needs to be undergone, resulting in some cases in an increase in the fabrication process. The increase in fabrication process leads to an increase in fabrication costs.

On the other hand, in a method of fabricating semiconductors, some attempts are known which form plural regions that are different in dopant concentration from each other, without increasing the number of photolithography processes. Among the known examples are: a method where when implanting ions into a semiconductor layer using a mask, the ion implantation is performed in a predetermined mask shape and with a predetermined density and thereafter by reducing the mask size and causing the mask to move backward, the ion implantation is performed with another density (Patent Document 3 and the like); a method where, by providing a portion where the ion implantation is performed through a film that partially passes ions therethrough, a region where the ion implantation is performed without passing through the film that partially passes the ions therethrough, and another region where a dopant concentration distribution varies in a depth direction, are formed simultaneously (a literature such as Patent Document 4); and a method where a stepped surface or a slanted cross-sectional shaped portion is provided to a mask, and dopants are ion implanted through this mask and thereafter the dopants are thermally diffused (a literature such as Patent Document 5).

Also known is an alignment mark having a slanted structure with a double stepped bottom (Patent Document 6, for example).

RELATED ART DOCUMENT

Patent Document

Patent Document 1 JP-A-2001-508950
Patent Document 2 JP-A-2003-303956
Patent Document 3 JP-A-S61-59868
Patent Document 4 JP-A-H08-321516
Patent Document 5 JP-A-H09-8050
Patent Document 6 JP-A-2007-273727

SUMMARY OF THE INVENTION

Problems that the Invention is to Solve

In doping methods by ion implantation as in Patent Document 1 through Patent Document 5, however, from a viewpoint of reduction of the fabrication costs, there has been insufficient simplified fabrication process in some cases, such as a case where the ion implantation process, other than the photolithography process, is not reduced. Another case has been that it is difficult to apply a semiconductor device of SiC where a dopant concentration is not easy to diffuse.

The present invention is directed to overcome the above problems, and an object of the invention is to provide a semiconductor device that can facilitate fabrication of a termination structure for the semiconductor device, without increasing the numbers of ion implantation processes and photolithography processes. Another object of this invention is to provide a fabricating method that enables easy fabrication of the termination structure of the semiconductor device, without increasing the numbers of ion implantation processes and photolithography processes.

Means for Solving the Problems

A semiconductor device according to the present invention comprises a first conductivity type drift layer formed on a first main surface of a semiconductor substrate; an element region formed in a surface portion of the drift layer; a recess formed in a loop in a laterally outer portion of the drift layer, the laterally outer portion being spaced away a predetermined distance from the element region; and a second conductivity type dopant region formed ranging from a bottom of the recess to a position away from the recess and toward the element region, a thickness of the dopant region where the recess is provided being smaller than that where no recess is provided.

Further, a method of fabricating a semiconductor device according to the present invention comprises the steps of forming a first conductivity type drift layer on a semiconductor substrate; forming in the drift layer a ring shaped recess so as to surround a region that serves as an element region; forming a planarized film on surfaces of the recess and the drift layer; and forming a resist mask on the planarized film, the resist mask having an opening that ranges from a bottom of the recess to a predetermined position away from the recess and toward the element region, to perform an ion implantation of a second conductivity type dopant into the drift layer.

Advantageous Effects of the Invention

In the present invention, without increasing the numbers of ion implantation processes and photolithography processes, a semiconductor device having a termination structure that has a high electric field relaxation capability can easily be fabricated, thus reducing fabrication costs.

BRIEF DESCRIPTION OF DRAWINGS

FIG. 7 is a set of cross-sectional views schematically showing a method of fabricating the semiconductor device according to Embodiment 2 of the present invention;

FIG. 8 is a cross-sectional view schematically showing a semiconductor device according to Embodiment 3 of the present invention;

MODES FOR CARRYING OUT THE INVENTION

Embodiment 1

Figure 1:
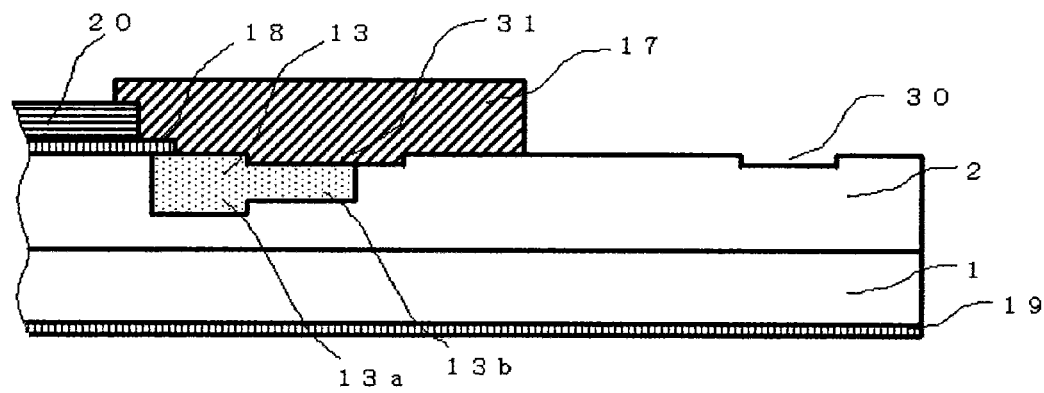
FIG. 1 is a cross-sectional view schematically showing a semiconductor device according to Embodiment 1 of the present invention.

A configuration of a semiconductor device in Embodiment 1 according to the present invention will be described first. FIG. 1 is a cross-sectional view showing the semiconductor device in Embodiment 1 according to the present invention.

FIG. 1 is a cross-sectional view of the semiconductor device, which is an SiC Schottky diode. Referring now to FIG. 1, a drift layer 2 is formed on a first main surface of a semiconductor substrate 1, and an anode electrode 18 (Schottky electrode) is formed on a surface of the drift layer 2.

A recess (indentation) 31 is provided in a laterally outer surface portion of the drift layer 2, spaced away a predetermined distance from an edge of the anode electrode 18, and a dopant region 13 is formed ranging from the edge of the anode electrode 18 to the bottom of the recess 31.

The dopant region 13 is deeply formed in a first dopant region 13a where no recess 31 is provided, while shallowly in a second dopant region 13b underneath the recess 31. Moreover, provided in the surface portion of the drift layer 2 located further outwardly from the recess 31 is a recess structure that serves as an alignment mark 30.

In addition, a cathode electrode 19 is formed on an opposite side of the first main surface of the semiconductor substrate 1 and in contact with a second main surface, and a wiring electrode (metallization electrode) 20 is formed on the anode electrode 18. Further, a dielectric film 17 is formed ranging from a position on the anode electrode 18 and the wiring electrode 20 to a position on the drift layer 2 where a recess structure is provided.

Figure 2:
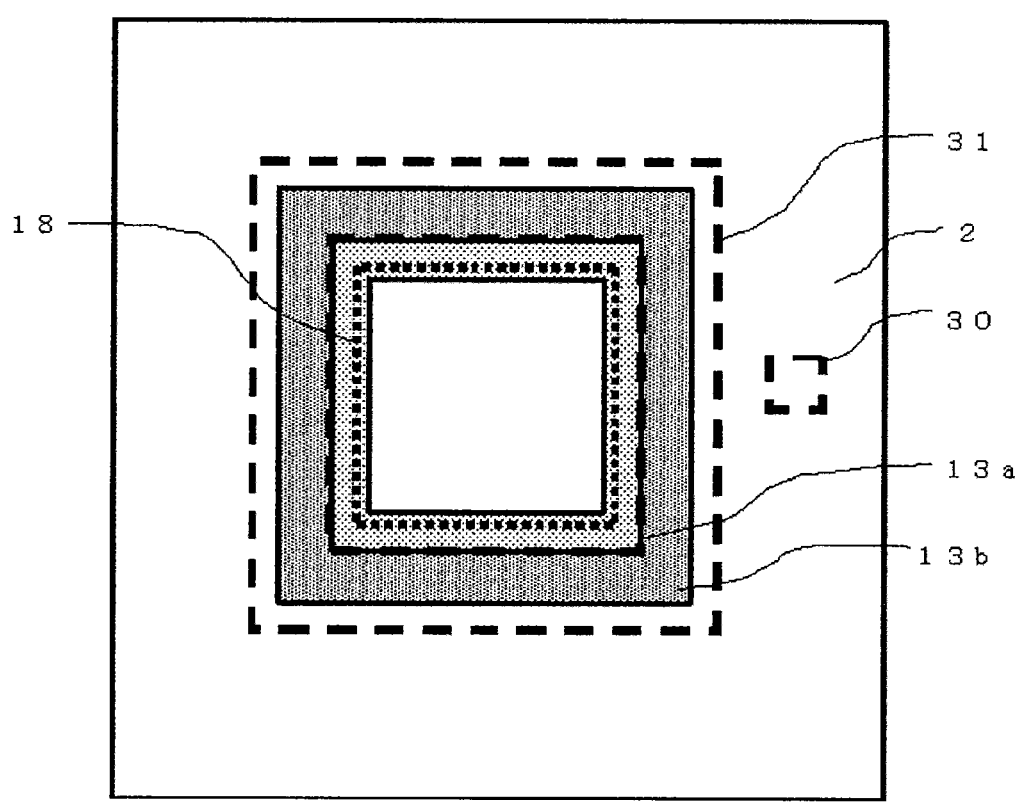
FIG. 2 is a plan view schematically showing the semiconductor device according to Embodiment 1 of the present invention.

FIG. 2 is a plan view showing the semiconductor device according to Embodiment 1 of the present invention. Referring to FIG. 2, the recess 31 and the alignment mark 30—which are recess structures—and the anode electrode 18, are shown in dotted lines; in order to clearly indicate a relationship mainly between the recess structure and the dopant region 13, portions other than the recess structure and the dopant region 13 are shown transparent.

Referring to FIG. 2, an electric field relaxation structure, called termination structure, is formed in a perimeter of an element region where the anode electrode 18 is formed. The dopant region 13 is formed in a loop ranging from underneath the edge of the anode electrode 18, i.e., a position in an inward direction from the recess 31 (a position away from the recess 31 and toward the element region) to the middle on the bottom of the recess 31. And the alignment mark 30 is formed isolatedly outside the recess 31.

Here, the semiconductor substrate 1 is a low-resistance n-type SiC substrate. The drift layer 2, which is an n-type SiC semiconductor layer, is formed according to the breakdown voltage specification for a diode of n-type SiC, with a thickness of between 4 μm and 150 μm, for example, and with a dopant concentration of between $5\times10^{14}$ and $3\times10^{16}$ cm$^{-3}$, for example. It will be adequate if the recess 31 and the alignment mark 30 each have a depth of 0.1 μm or more, and adequate if they have a depth of 0.3 μm or more and of 0.8 μm or less, for example.

The first dopant region 13a and the second dopant region 13b are each formed of a p-type SiC semiconductor, and a dopant sheet density of the second dopant region 13b is determined to be smaller than that of the first dopant region 13a. Here, the dopant sheet density refers to a value calculated by multiplying the thickness (depth) of the dopant region by the dopant density per volume of the dopant region. It will be adequate if dopant densities per unit volume in the first and second dopant regions 13a, 13b range from about $1\times10^{17}$ to about $1\times10^{19}$ cm$^{-3}$, depending upon the breakdown voltage specification for the diode.

It will be also adequate if the anode electrode 18 is of a material such as titanium and if the cathode electrode 19 is of a material such as nickel. And it will be adequate if the wiring electrode 20 is of a material such as low-resistant aluminum or copper. Further, the dielectric film 17 may be a non-organic dielectric film such as of SiN or SiO$_2$, or alternatively be an organic dielectric film such as of polyimide.

A method of fabricating an SiC Schottky diode, which is a semiconductor device according to the present embodiment, will be described next. FIG. 3 is a set of schematic cross-sectional views illustrating the method of fabricating the semiconductor device according to the present embodiment.

Figure 3A:
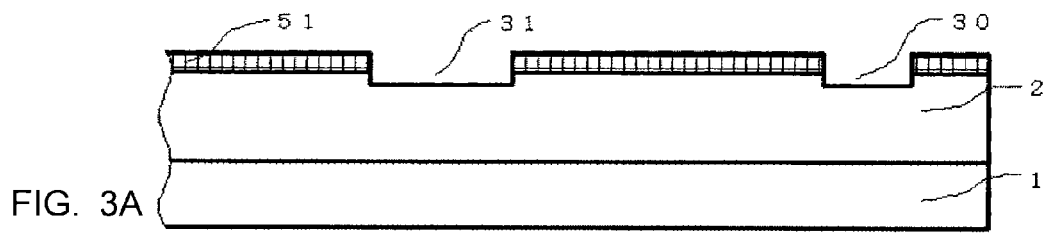
FIG. 3 is a set of cross-sectional views schematically showing a method of fabricating the semiconductor device according to Embodiment 1 of the present invention.

As shown in FIG. 3A, a resist mask 51, having openings at predetermined positions, is first formed on a surface of the drift layer 2 of the semiconductor substrate 1 that has the epitaxially grown drift layer 2 on the surface thereof, and the drift layer 2 is partially etched through the resist mask 51. The openings in the resist mask 51 are formed at positions where the recess 31 and the alignment mark 30 will be formed later.

It will be adequate if the etching is performed by a dry etching method such as reactive ion etching (RIE). The recess structures, which serve as the recess 31 and the alignment mark 30, have the same etched depth, and the depth is determined to be 0.1 μm or more so that the etched portion is easy to recognize as the alignment mark.

Figure 3B:
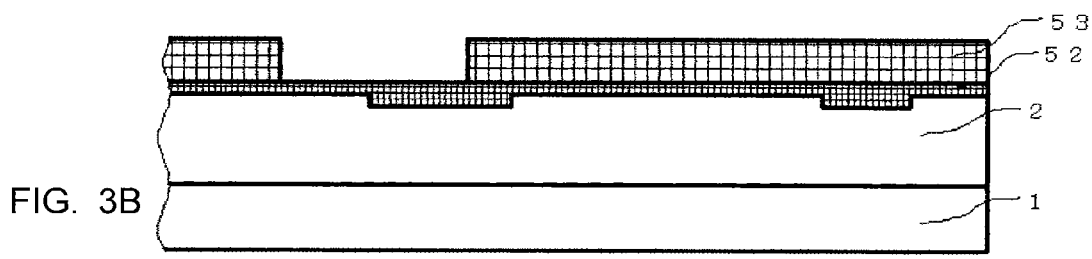

As shown in FIG. 3B, the resist mask 51 formed in FIG. 3A is next removed to form a planarized film 52 on an entire surface of the drift layer 2 where the recess 31 and the alignment mark 30 have been provided. In addition, a resist mask 53 is formed on the planarized film 52. An opening is beforehand made in the resist mask 53 at a position that corresponds to the dopant region 13.

Here, the thickness of the planarized film 52 is made to be greater than the depth of the recess 31 so that the planarized film 52 is coated even at places other than the recess 31. It will be adequate if, in a place where no recess structure is provided, the thickness of the planarized film 52 is preferably within about twice the depth of the recess structure, for example, about 0.1 μm to about 0.8 μm.

Figure 3C:
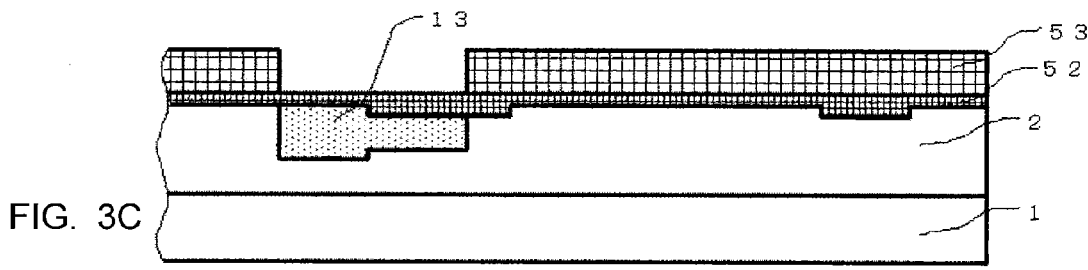
Figure 3D:
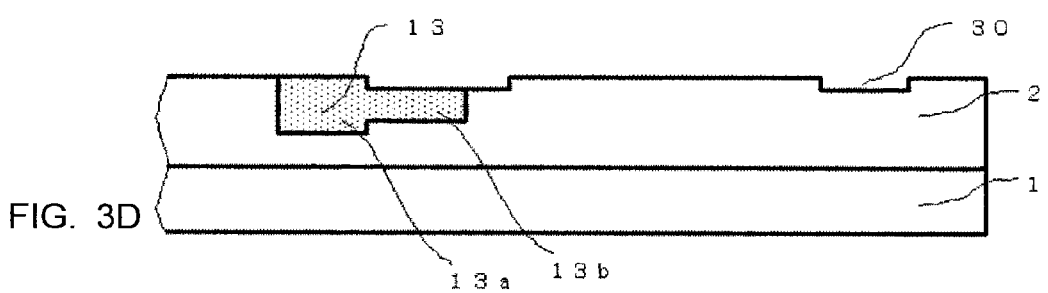

As shown in FIG. 3C, ions for forming the dopant region 13 is next implanted through the planarized film 52 and the resist mask 53. When the p-type dopant region 13 is formed, it will be adequate if the p-type dopant such as aluminum or boron is implanted. Depending on the thickness of the planarized film 52 and the type of ion, the acceleration energy may range from 200 keV to 700 keV, preferably, from about 350 keV to about 500 keV. As shown in FIG. 3D, after removal of the planarized film 52 and the resist mask 53, ions implanted are subsequently heat treated for activation, and the anode electrode 18, the wiring electrode 20 and the dielectric film 17 are formed to one side of the drift layer 2, and the cathode electrode 19 is formed in contact with the second main surface of the semiconductor substrate 1 and thereby the SiC Schottky diode shown in FIG. 1 can be fabricated.

Here, it will be adequate if the planarized film 52 is of a material such as a spin on glass (SOG) film that is formed by rotation coating. However, the invention is not limited to this material as long as the film is a material that can be planarized and coated, and a material such as a photo resist having low viscosity may be employed. Here again, if there is a difference in ion transmissivity between the SiC semiconductor, which is a material of the drift layer 2, and the planarized film 52, then there occurs a difference between absolute depths to which the ions reach in regions where the recess 31 is provided and where no recess structure is provided, thus resulting in the bottoms of the first and second dopant regions 13a, 13b being formed at different depths. For example, in situations where the planarized film 52 has no crystal structure, but the drift layer 2 has a crystal structure, the planarized film 52 at a place with no crystal structure is formed thin in thickness and thus, depending on a crystal plane of the drift layer 2, due to an influence of channeling during ion implantation, the bottom of the first dopant region 13a is in some cases formed at a deeper place than that of the second dopant region 13b.

The opening of the resist mask 53 is determined to include an edge of the recess 31. Doing this way allows the absolute depths of the first and second dopant regions 13a, 13b (a depth from the surface of the drift layer 2 where no recess structure is provided) to vary. Further, since the second dopant region 13b has been formed in the recess 31, a big difference in thickness can be made between the first and second dopant regions 13a, 13b, and the first dopant region 13a can be made to be greater in thickness than the second dopant region 13b. As a result, a big difference can be made also in dopant sheet density between the first and second dopant regions 13a, 13b, allowing the breakdown voltage to be enhanced.

Figure 4:
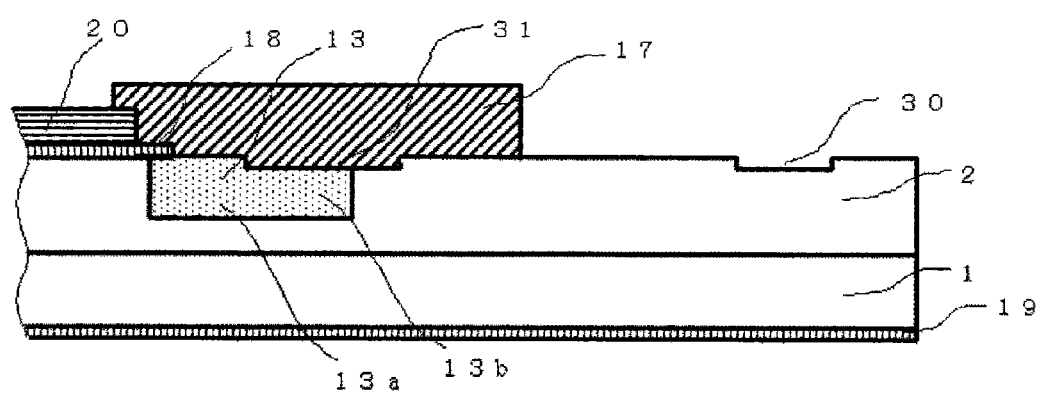
FIG. 4 is a cross-sectional view schematically showing the semiconductor device according to Embodiment 1 of the present invention.
Figure 5:
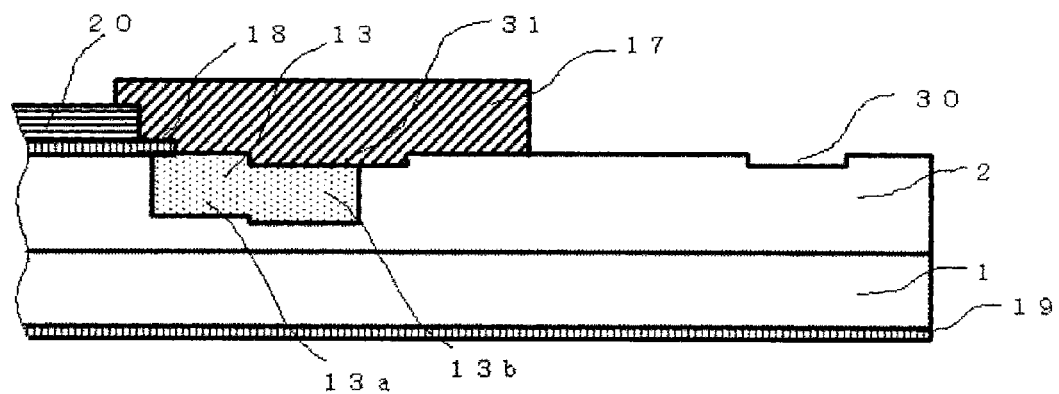
FIG. 5 is another cross-sectional view schematically showing the semiconductor device according to Embodiment 1 of the present invention.

Note that when there is no difference in ion transmissivity between the SiC semiconductor and the planarized film 52, the first and second dopant regions 13a, 13b have in some cases the same degree of absolute depth, as shown in the schematic cross-sectional view in FIG. 4. Since, even in such a situation, there is a difference in thickness between the first and second dopant region 13a, 13b, the second dopant region 13b can be made to have a smaller dopant sheet density than the first dopant region 13a. In addition, in some cases, the planarized film 52 has higher ion transmissivity than the SiC semiconductor or, because of the influence of channeling, the absolute depth of the second dopant region 13b is greater than that of the first dopant region 13a, as shown in the schematic cross-sectional view in FIG. 5. Even in such a situation, the thickness of the second dopant region 13b is smaller than that of the first dopant region 13a, and thus the second dopant region 13b can be made to have a smaller dopant sheet density than the first dopant region 13a.

Further, when the planarized film 52 has no crystal structure and the SiC semiconductor has a crystal structure, and if the crystal orientation of the SiC semiconductor is tilted, then, by taking also the tilt into account to determine a direction for conducting the ion implantation, the channeling effect can be increased, allowing further increase in dopant sheet density at a place where no recess structure is provided than where a recess structure is provided.

In this way, according to a semiconductor device in the present embodiment, its breakdown voltage can be enhanced with a simple configuration. Further, according to a method of fabricating the semiconductor device according to the present embodiment, a termination structure can be easily fabricated which provides a high breakdown voltage, thus allowing reduction in fabrication costs.

Embodiment 2

Figure 6:
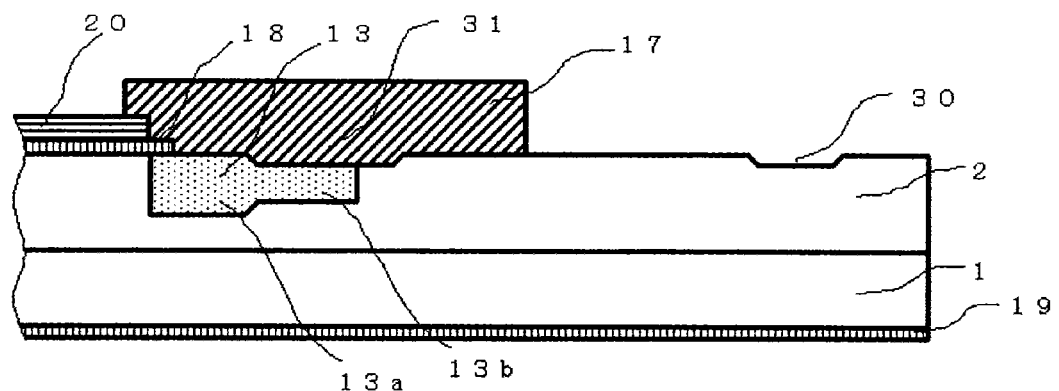
FIG. 6 is a cross-sectional view schematically showing a semiconductor device according to Embodiment 2 of the present invention.

The configuration of an SiC Schottky diode that is a semiconductor device according to Embodiment 2 of the present invention will be described below. FIG. 6 is a schematic cross-sectional view showing the SiC Schottky diode according to Embodiment 2 of the present invention.

In the semiconductor device according to Embodiment 1, side walls of the recess structures—the recess 31 and the alignment mark 30—are formed perpendicular to the surface of the drift layer 2, whereas in the semiconductor device according to the present embodiment, the side walls are slanted. Since the rest of the portions are the same as those described in Embodiment 1, their detailed descriptions will not be provided herein.

Referring to FIG. 6, the dopant region 13 is formed astride the edge of the anode electrode 18, in the surface portion of the drift layer 2 underneath the edge of the anode electrode 18. The recess 31, having slanted side walls, are formed in the surface portion of the drift layer 2 located outwardly from the edge of the anode electrode 18. The dopant region 13 is deeply formed in the first dopant region 13a where no recess 31 is provided, while shallowly formed in the second dopant region 13b underneath the recess 31. Here, the second dopant region 13b is formed in a planar direction up to a position where the recess 31 is provided.

In addition, the recess structure, having the slanted side walls, that serves as the alignment mark 30, is formed in the surface portion of the drift layer 2 located further outwardly from the recess structure.

It will be adequate if slant angles of the side walls of the recess structures, the recess 31 and the alignment mark 30, are about 45 degrees or greater against the surface of the drift layer 2—for example, between about 45 degrees and about 75.

A method of fabricating the silicon carbide Schottky diode that is the semiconductor device according to the present embodiment will be described next. FIG. 7 is a schematic cross-sectional view describing the method of fabricating the semiconductor device according to the present embodiment.

As shown in FIG. 7A, first formed in the surface of the epitaxially grown drift layer 2 on the semiconductor substrate 1 that has the drift layer 2 on its surface, is the resist mask 51 having openings at predetermined places, through which the drift layer 2 is partially etched in a slant shape. It will be adequate if the etching is performed by a dry etching method such as reactive ion etching (RIE).

As shown in FIG. 7B, the resist mask 51 formed in FIG. 7A is next removed and the planarized film 52 is formed across an entire surface of the drift layer 2. Further, the resist mask 53 is formed on the planarized film 52. An opening is beforehand made in the resist mask 53 at a place that corresponds to the dopant region 13.

As shown in FIG. 7C, ions, serving as the p-type dopant, for forming the dopant region 13 are next implanted through the planarized film 52 and the resist mask 53. After removal of the planarized film 52 and the resist mask 53 as shown in FIG. 7D, the anode electrode 18, the wiring electrode 20 and the dielectric film 17 are subsequently formed to one side of the drift layer 2, and the cathode electrode 19 is also formed in contact with the second main surface of the semiconductor substrate 1, whereby the SiC Schottky diode shown in FIG. 6 can be fabricated.

According to the semiconductor device in the present embodiment, in addition to being able to form plural regions having different dopant surface densities in the dopant region 13 astride the edge of the recess 31, another region where the dopant sheet density varies gradually can be formed in a boundary region between the plural regions having different dopant surface densities, by using intermediate densities between the dopant surface densities of two neighboring regions, so that semiconductor devices can be provided which are of termination structure having an electric field relaxation capability further enhanced. Further, semiconductor devices of such termination structures having the electric field relaxation capability enhanced can easily be fabricated, thus reducing fabrication costs.

Embodiment 3

The configuration of an SiC Schottky diode that is a semiconductor device according to Embodiment 3 of the present invention will be described below. FIG. 8 is a schematic cross-sectional view showing the semiconductor device according to Embodiment 3 of the present invention.

In the semiconductor device according to the present embodiment, the recess structure, which has a single stepped bottom in the semiconductor device of Embodiment 2, is formed to have a double stepped bottom. Since the rest of portions are the same as those described in Embodiment 2, their detailed descriptions will not be provided herein.

FIG. 8 is a schematic cross-sectional view of the semiconductor device that serves as the SiC Schottky diode. Referring to FIG. 8, the alignment mark 30 and the recess 31, provided in the surface portion of the drift layer 2, have recess structures with a double stepped bottom. The recess structures have the slanted side walls with a double stepped bottom, and their details are as described in Patent Document 6.

The dopant region 13 is separated into three regions, a third dopant region 13c, a fourth dopant region 13d and a fifth dopant region 13e. The fourth dopant region 13d is smaller in thickness than the third dopant region 13c, and the fifth dopant region 13e is smaller in thickness than the fourth dopant region 13d.

Further, the dopant surface densities of the third dopant region 13c, the fourth dopant region 13d, and the fifth dopant region 13e decrease in that order.

Figure 9:
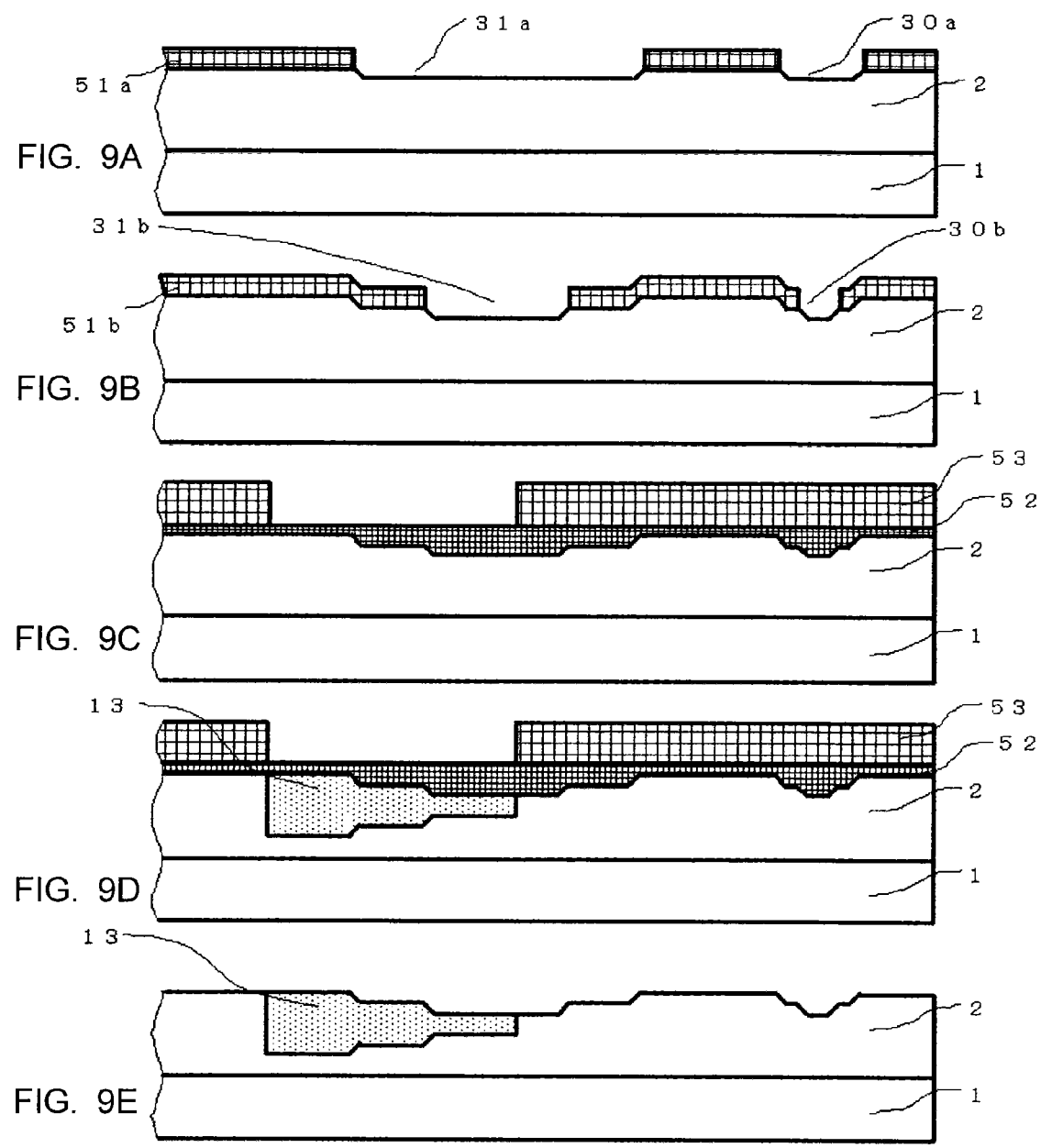
FIG. 9 is a set of cross-sectional views schematically showing a method of fabricating the semiconductor device according to Embodiment 3 of the present invention.

The method of fabricating the SiC Schottky diode that is the semiconductor device according to the present embodiment will be described next. FIG. 9 is a set of schematic cross-sectional views describing the method of fabricating the semiconductor device according to the present embodiment.

As shown in FIG. 9A, a resist mask 51a having openings at predetermined places is first formed on the surface of the epitaxially grown drift layer 2 on the semiconductor substrate 1 that has the drift layer 2 on its surface, and the drift layer 2 is partially etched slantly through the resist mask 51a. The openings of the resist mask 51a are made at places where a recess 31a and an alignment mark 30a will be formed later.

As shown in FIG. 9B, after removal of the resist mask 51a, subsequently formed is a resist mask 51b that has openings only on the bottoms—formed as described in FIG. 9A—of the recess 31a and the alignment mark 30a, and then the bottoms of the recess structures are slantly etched through the resist mask 51b.

It will be adequate if these two etching processes are performed by a method such as dry etching. The etched depth is determined to be 0.1 μm or greater so that the etched portion can be recognized as the alignment mark; however, the depth is determined so as not to be above 1 μm. It will be adequate if the slant angle is 45 degrees or greater, e.g., between 45 degrees and about 75 degrees, against the surface of the drift layer.

As shown in FIG. 9C, after removal of the resist mask 51b, the planarized film 52 is subsequently formed across an entire surface of the drift layer. In addition, another resist mask—the resist mask 53—is formed on the planarized film 52. An opening is beforehand made in the resist mask 53 at a portion that corresponds to the dopant region 13.

As shown in FIG. 9D, ions for forming the dopant region 13 is next implanted through the planarized film 52 and the resist mask 53. The dopant region 13 is formed at positions ranging from the surface portion of the drift layer 2—which is the edge of the Shottcky electrode 18 and where a recess has not been formed—to the bottom of the recess structure.

After removal of the planarized film 52 and the resist mask 53 as shown in FIG. 9E, the anode electrode 18, the wiring electrode 20 and the dielectric film 17 are subsequently formed to one side of the drift layer 2, and the cathode electrode 19 is also formed in contact with the second main surface of the semiconductor substrate, whereby the Schottky diode, shown in FIG. 8, can be fabricated.

According to the semiconductor device of the present embodiment, in this way, one ion implantation process allows formation of three different surface densities of the dopant region, thus facilitating providing the termination structure that achieves a high breakdown voltage. In addition, at the same time, the alignment mark 30 can be provided which has less error in recognition. Further, as in the semiconductor device according to the present embodiment, slanting the side walls of the recess structures allows formation of a transition region of the dopant sheet density between dopant regions of three different dopant sheet densities, so that a semiconductor device can be provided of a termination structure having higher electric field relaxation structure.

Embodiment 4

Figure 10:
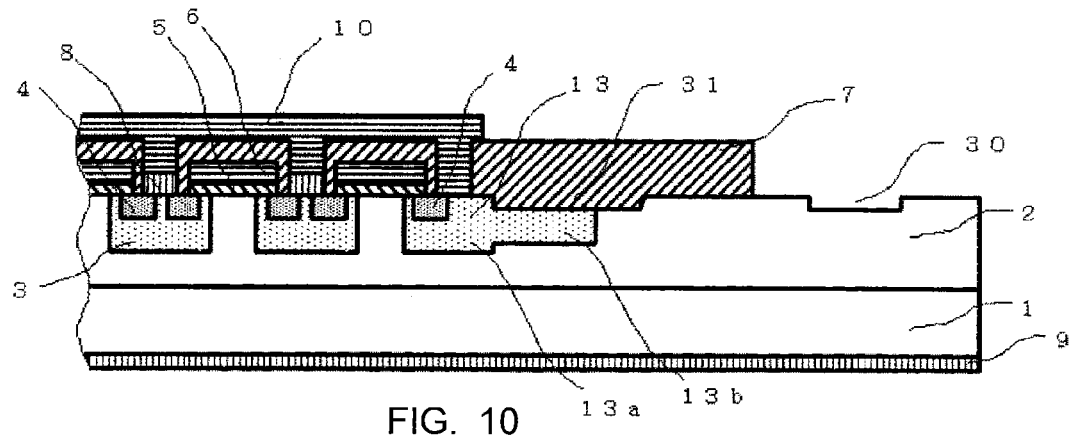
FIG. 10 is a cross-sectional view schematically showing a semiconductor device according to Embodiment 4 of the present invention.

The configuration of a semiconductor device according to Embodiment 4 will be described. FIG. 10 is a set of schematic cross-sectional views showing the semiconductor device according to Embodiment 4 of the present invention. In the semiconductor device according to the present embodiment, a metal oxide semiconductor field effect transistor (MOSFET) is used as the semiconductor element, which has been the Schottky diode in Embodiment 1 through Embodiment 3. The rest of portions are the same as those described in Embodiment 1 and Embodiment 2, and thus their detailed descriptions will not be provided herein.

FIG. 10 is a schematic cross-sectional view of the semiconductor device, which is the SiC MOSFET. Referring to FIG. 10, the drift layer 2 of the n-type SiC semiconductor is formed on the semiconductor substrate 1 that is made up of the n-type SiC, and a p-type well region 3 is selectively formed in the upper region of the drift layer. Further, an n-type source region 4 is selectively formed in upper surface portions within the well regions 3. In addition, a gate dielectric film 5 and a gate electrode 6 are formed in a region astride the drift layer 2, the well regions 3 and the source regions 4, and further an inter-layer dielectric film 7 is formed at a higher position than this region and on the drift layer 2 located in the periphery of the element region. In the inter-layer dielectric film 7, a portion for making contact with two regions, the source region 4 and the well region 3, is made open, where a source electrode 8 and a wiring metal 10 are formed. In addition, a drain electrode 9 is formed on the other side—a second main surface—of the semiconductor substrate 1.

In the outmost circumference of the element region where the MOSFET is formed, an electric field relaxation structure called termination structure is formed in connection with the well region 3. In the termination structure, the recess (concave) 31 is provided in a laterally outer surface portion of the drift layer 2, spaced away a predetermined distance from the outmost circumference of the element region, and the dopant region 13 is formed ranging from the outmost circumferential well region 3 to the bottom of the recess 31.

The dopant region 13 is deeply formed in the first dopant region 13a where no recess 31 is provided, while shallowly formed in the second dopant region 13b underneath the recess 31. In addition, formed in the surface portion of the drift layer 2 located further outwardly from the recess structure is another recess structure that serves as the alignment mark 30. Formed on the recess 31 is a dielectric film that is the same as the inter-layer dielectric film 7.

A method of fabricating the SiC MOSFET, which is a semiconductor device according to the present embodiment, will be described next. FIG. 11 is a schematic cross-sectional view describing the method of fabricating the semiconductor device according to the present embodiment.

Figure 11A:
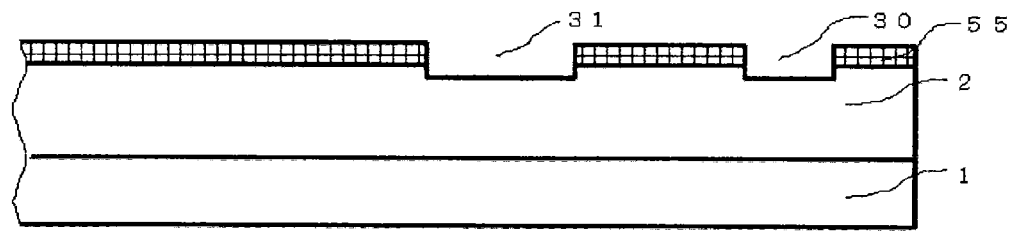
FIG. 11 is a set of cross-sectional views schematically showing a method of fabricating the semiconductor device according to Embodiment 4 of the present invention.

As shown in FIG. 11A, a resist mask 55 having openings at a predetermined place is first formed on the surface of the epitaxially grown drift layer 2 on the semiconductor substrate 1 that has the drift layer 2 on its first main surface, and the drift layer 2 is partially etched through the resist mask 55. It will be adequate if the etching is performed by a dry etching method such as reactive ion etching (RIE). Openings in the resist mask 55 are provided at places where the recess structure and the alignment mark 30 will be formed later.

Figure 11B:
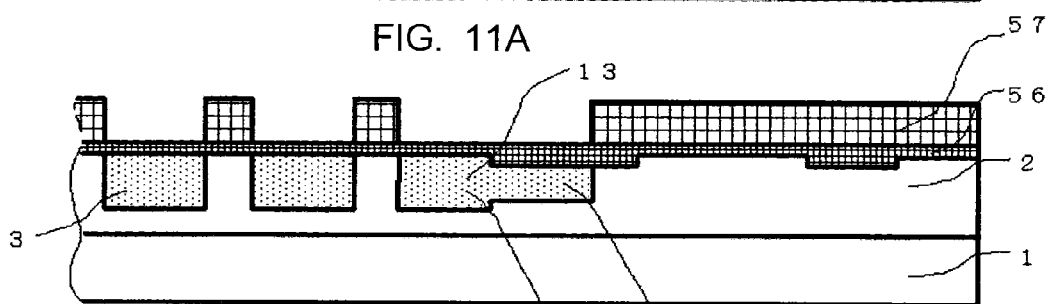

As shown in FIG. 11B, after removal of the resist mask 55 formed in FIG. 11A, a planarized film 56 is next formed across an entire surface of the drift layer 2. Further, a resist mask 57 is formed on the planarized film 56. Openings are beforehand made in the resist mask 57 at places that correspond to the dopant region 13 and the well regions 3.

Figure 11C:
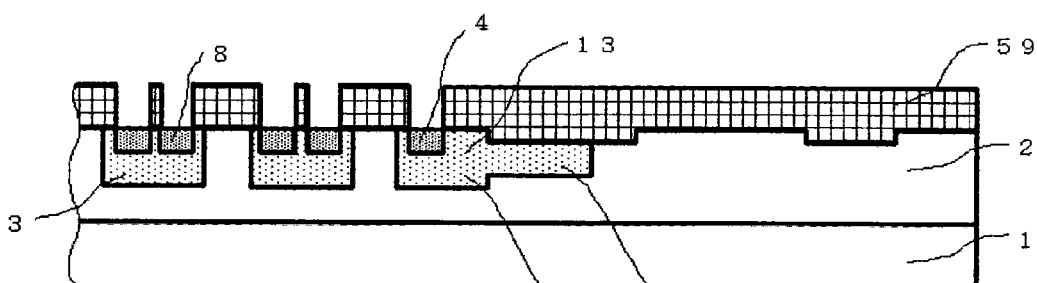

As shown in FIG. 11B, the p-type dopant ions for forming the dopant region 13 and the well regions 3 are next implanted through the planarized film 56 and the resist mask 57. After removal of the planarized film 56 and the resist mask 57 as shown in FIG. 11C, a resist mask 59 is subsequently formed and then the n-type dopant ions for forming the source regions 4 are implanted. After removal of the resist mask 59, the source electrode 9 and the wiring electrode 10 are further formed to one side of the drift layer 2, and the drain electrode 9 is also formed in contact with the second main surface of the semiconductor substrate 1, thereby allowing fabrication of the SiC MOSFET shown in FIG. 10.

According to the semiconductor of the present embodiment, the ion implantation that is the same as in the formation of the MOSFET well region 3 can form the dopant region 13 and then a MOSFET can easily be provided which has a termination structure having an electric field relaxation capability improved. Further, the semiconductor device having such a termination structure of an enhanced electric field relaxation capability can easily be fabricated, so that fabrication costs can be reduced.

Figure 12:
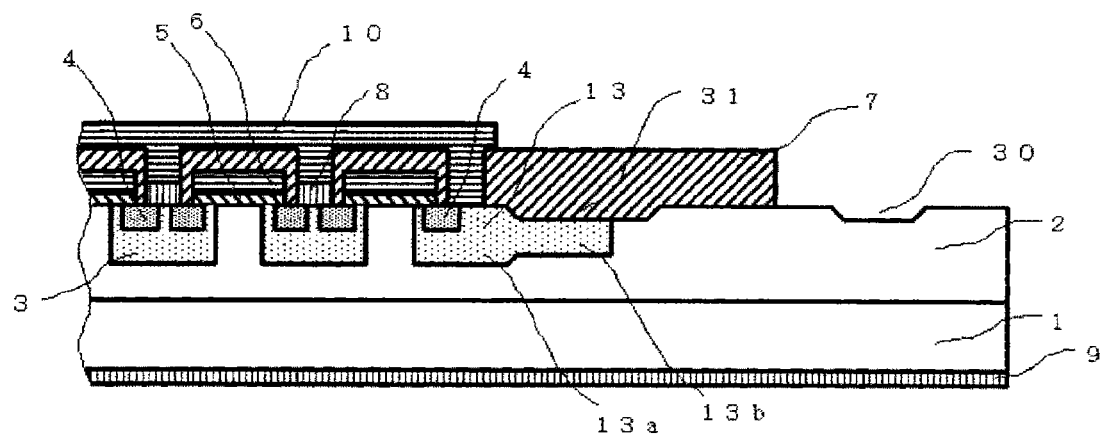
FIG. 12 is another cross-sectional view schematically showing the method of fabricating the semiconductor device according to Embodiment 4 of the present invention.

Here, according to the semiconductor device in the present embodiment, the side walls of the recess structures, the recess 31 and the alignment mark 30, are formed perpendicular to the surfaces of the structures; however, by slanting the side walls of the recess structure as shown in FIG. 12 that exemplifies the cross sectional structure, in addition to being able to form plural regions having different dopant surface densities in the dopant region 13 astride the edge of the recess 31, another region where the dopant sheet density varies gradually can be formed in a boundary region between the plural regions having the different dopant surface densities, by using intermediate densities between the dopant surface densities of two neighboring regions, so that semiconductor devices can be provided which are of termination structure having an electric field relaxation capability further enhanced.

Further, in the semiconductor device according to the present embodiment, the dielectric film to be formed on the recess 31 is the same as an dielectric film for the inter-layer dielectric film 7; however, the dielectric film to be formed on the recess 31 may be an dielectric film such as of an organic material that is different from that of the inter-layer dielectric film 7.

Here, in Embodiment 1 through Embodiment 4, the description assumes that the first conductivity type device is of n-type and the second conductivity type device is of p-type; however, the embodiments are not limited to this example, and by assuming the first p-type conductivity type device and the second n-type conductivity type device, a similar advantageous effect is also achieved.

Embodiment 1 through Embodiment 4 are described by exemplifying the SiC semiconductor, and a similar advantageous effect is also achieved in the case of a semiconductor device of another semiconductor material such as a nitride semiconductor—including GaN—GaAs and Si.

The SiC semiconductor needs to make an activation anneal temperature high after the ion implantation, and there is a great need for forming an alignment mark as a recess structure; thus, applying the present invention to SiC semiconductors leads to much reduction in process, achieving a much more advantageous effect. The dopant in the SiC semiconductor is more difficult to diffuse than those in semiconductors of other materials and thus, when the dopant region is formed by applying the present invention, an advantageous effect of intentionally forming a dopant concentration distribution in the dopant region is more significant than when the present invention is applied to the semiconductors of other materials; hence, the SiC semiconductor also achieves a much more advantageous effect in improving the electric field relaxation characteristic.

For Embodiment 1 through Embodiment 4, descriptions are provided using examples of MOSFET and Schottky diode serving as a semiconductor device; however, the semiconductor device according to the present invention is not limited to these examples. And even if applied to a power semiconductor device for use in high voltage, such as a pn diode and an insulated gate bipolar transistor (IGBT), the semiconductor device further achieves a similar advantageous effect.

REFERENCE NUMERALS

1 Semiconductor substrate
2 Drift layer
3 Well region
4 Source region
5 Gate dielectric film
6 Gate electrode
7 Inter-layer dielectric film
8 Source electrode
9 Drain electrode
13 Dopant region
17 Dielectric film
18 Anode electrode
19 Cathode electrode
20 Wiring electrode
30 Alignment mark
31 Recess
51, 53, 55, 57 and 59 Resist mask
52 and 56 Planarized film

The invention claimed is:

1. A semiconductor device comprising:
a first conductivity type drift layer formed on a first main surface of a semiconductor substrate;
an element region formed in a surface portion of the drift layer;
a recess formed in a loop in a laterally outer portion of the drift layer, the laterally outer portion being spaced away a predetermined distance from the element region; and
a second conductivity type dopant region formed ranging from a bottom of the recess to a position away from the recess and toward the element region, a thickness of the dopant region where the recess is provided being smaller than that where no recess is provided,
wherein a bottom surface of the dopant region where the recess is provided has a different depth than a depth of a bottom surface of the dopant region where no recess is provided.

2. The semiconductor device of claim 1, wherein the semiconductor substrate and the drift layer are formed of silicon carbide and an alignment mark having a recess structure is formed in the drift layer located outwardly from the recess.

3. The semiconductor device of claim 2, wherein the recess formed in the loop in the drift layer has the same depth as the recess structure of the alignment mark.

4. The semiconductor device of claim 1, wherein the bottom of the dopant region where no recess is provided is deeper from a surface of the drift layer than the bottom of the dopant region where the recess is provided.

5. The semiconductor device of claim 1, wherein a bottom surface of the dopant region gradually changes in depth in a region between a bottom of the recess and a region where no recess is provided.

6. The semiconductor device of claim 1, wherein a bottom of the dopant region where no recess is provided is shallower from a surface of the drift layer than the bottom of the dopant region where the recess is provided.

7. The semiconductor device of claim 1, wherein the recess has a double stepped bottom.

8. The semiconductor device of claim 7, wherein a bottom of the dopant region where a depth of the recess is smaller is deeper from a surface of the drift layer than that where the depth of the recess is greater.

9. The semiconductor device of claim 1, wherein a side wall of the recess formed in the loop in the drift layer is slanted relative to a plane perpendicular to the surface of the drift layer.

10. The semiconductor device of claim 1, wherein an element formed in the element region is a Schottky diode,
the element comprising
a Schottky electrode formed on a surface of the drift layer,
an ohmic electrode in contact with a second main surface of the semiconductor substrate, and
a dielectric film formed on the recess.

11. The semiconductor device of claim 1, wherein an element formed in the element region is a MOSFET,
the element comprising
a plurality of second conductivity type well regions formed in a surface portion of the drift layer,
a first conductivity type source region where a surface portion of the well region is partially formed,
a gate electrode formed above the well region, with a gate dielectric film intervening therebetween,
a source electrode connected with the source region and the well region,
an ohmic electrode formed in contact with a second main surface of the semiconductor substrate,
a dopant region connected to the well region located outermost, and
a dielectric film formed on the recess.

12. A method of fabricating a semiconductor device, comprising the steps of:
forming a first conductivity type drift layer on a semiconductor substrate;
forming in the drift layer a looped recess so as to surround a region that serves as an element region;
forming a planarized film on surfaces of the recess and the drift layer; and
forming a resist mask on the planarized film, the resist mask having an opening that ranges from a bottom of the recess to a predetermined position away from the recess and toward the element region, to perform an ion implantation of a second conductivity type dopant into the drift layer.

13. The method of fabricating the semiconductor device of claim 12, wherein the semiconductor substrate and the drift layer are formed of silicon carbide, and wherein in the step of forming the recess, the recessed alignment mark is formed in the drift layer located outwardly from the recess simultaneously with forming the recess.

14. The method of fabricating the semiconductor device of claim 13, wherein the recess and the recessed alignment mark each have a double stepped bottom.

15. The method of fabricating the semiconductor device of claim 12, further comprising a step of forming a Schottky diode or a MOSFET in the element region.

16. The semiconductor device of claim 9, wherein a side wall of said second conductivity type dopant region is perpendicular to a surface of said drift layer.

* * * * *